United States Patent
Fujimoto et al.

(10) Patent No.: US 10,593,405 B2
(45) Date of Patent: Mar. 17, 2020

(54) READ PROCESS IN A SEMICONDUCTOR MEMORY DEVICE INCLUDING A MEMORY CELL TRANSISTOR

(71) Applicant: Toshiba Memory Corporation, Minato-ku (JP)

(72) Inventors: Ryuichi Fujimoto, Ota (JP); Kan Shimizu, Saitama (JP); Shigehito Saigusa, Yokohama (JP); Motoki Nagata, Yokohama (JP); Yumi Takada, Yokohama (JP); Hitoshi Shiga, Kawasaki (JP); Makoto Morimoto, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/101,645

(22) Filed: Aug. 13, 2018

(65) Prior Publication Data

US 2019/0295649 A1 Sep. 26, 2019

(30) Foreign Application Priority Data

Mar. 22, 2018 (JP) ................................. 2018-054555

(51) Int. Cl.
*G11C 16/04* (2006.01)
*G11C 16/12* (2006.01)
(Continued)

(52) U.S. Cl.
CPC ...... *G11C 16/0483* (2013.01); *G11C 11/4085* (2013.01); *G11C 11/4091* (2013.01);
(Continued)

(58) Field of Classification Search
None
See application file for complete search history.

(56) References Cited

U.S. PATENT DOCUMENTS

| 4,243,937 | A | * | 1/1981 | Multani | ........... | G11C 29/50016 |
| | | | | | | 257/48 |
| 7,626,532 | B2 | | 12/2009 | Maruyama | | |

(Continued)

FOREIGN PATENT DOCUMENTS

| JP | 4340296 | 10/2009 |
| JP | 5207090 | 6/2013 |
| JP | 2015-204534 | 11/2015 |

OTHER PUBLICATIONS

G. Naso, et al., "A 128Gb 3b/cell NAND Flash Design Using 20nm Planar-Cell Technology," 2013 International Solid-State Circuits Conference, Digest of Technical Papers, 3 Pages.

*Primary Examiner* — J. H. Hur
(74) *Attorney, Agent, or Firm* — Oblon, McClelland, Maier & Neustadt, L.L.P.

(57) ABSTRACT

According to one embodiment, a semiconductor memory device includes: a word line; a first memory cell; a first circuit; and a second circuit. The first memory cell is connected to the word line. The first circuit generates a first voltage having a waveform including a first time period during which a voltage value increases with time and a second time period during which the voltage value decreases with time, and applies the generated first voltage to the word line. The second circuit measures first time from a first timing when a state of the first memory cell changes according to the first voltage to a second timing when the state of the first memory cell changes according to the first voltage after the first timing. The second circuit determines first data stored in the first memory cell on the basis of the measured first time.

18 Claims, 9 Drawing Sheets

(51) Int. Cl.
*G11C 11/408* (2006.01)
*G11C 11/4099* (2006.01)
*G11C 11/4091* (2006.01)
*G11C 16/26* (2006.01)

(52) U.S. Cl.
CPC .......... *G11C 11/4099* (2013.01); *G11C 16/12* (2013.01); *G11C 16/26* (2013.01)

(56) References Cited

U.S. PATENT DOCUMENTS

| | | |
|---|---|---|
| 7,782,674 B2 | 8/2010 | Roohparvar et al. |
| 7,948,802 B2 | 5/2011 | Sarin et al. |
| 2005/0141283 A1* | 6/2005 | Lee .................... G11C 16/0483 365/185.28 |
| 2009/0052256 A1* | 2/2009 | Sutardja .................. G11C 8/08 365/185.19 |
| 2009/0207159 A1* | 8/2009 | Govil .................... B81C 99/003 345/211 |
| 2010/0053386 A1* | 3/2010 | Sizukuisi ............... H04N 5/361 348/273 |
| 2013/0063997 A1* | 3/2013 | Maislos ................ G11C 16/26 365/45 |
| 2017/0110186 A1* | 4/2017 | Sasaki ................ G11C 11/5642 |

* cited by examiner

FIG.7
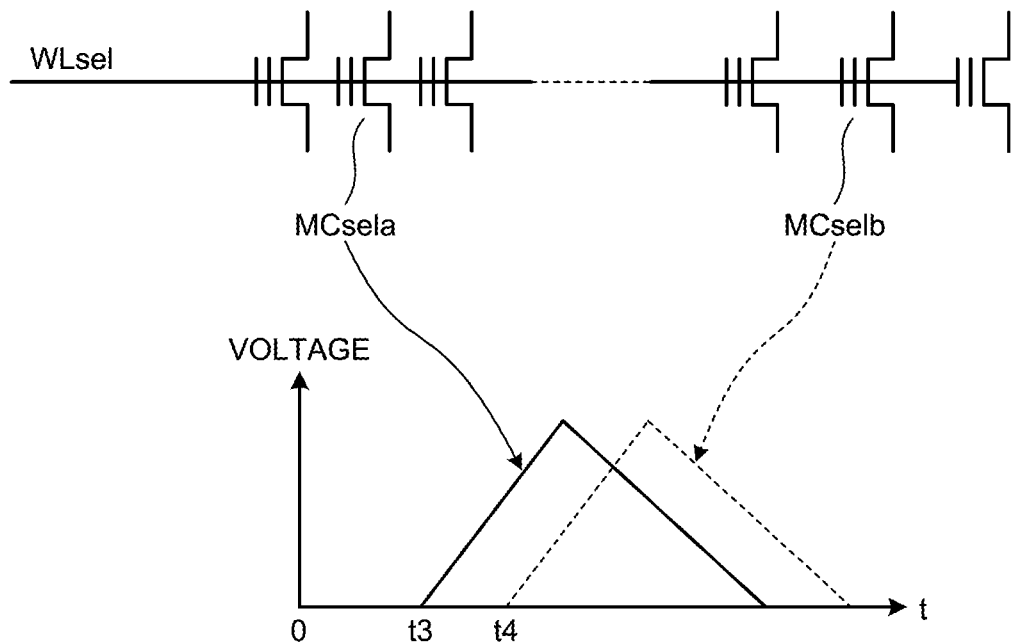
FIG.8
PRIOR ART
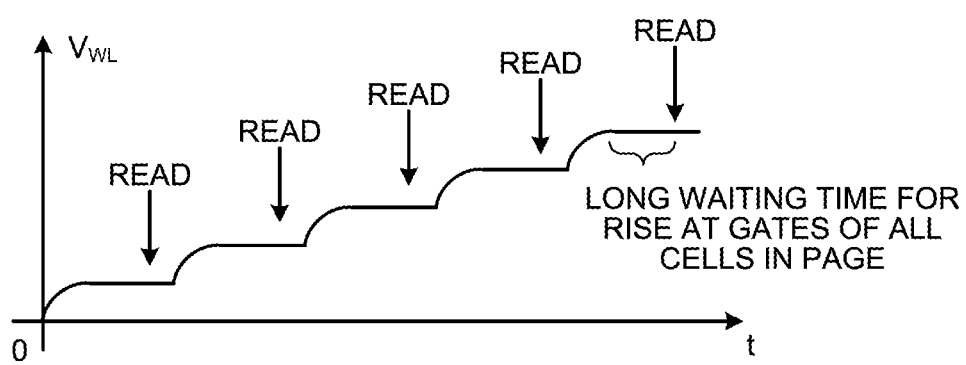
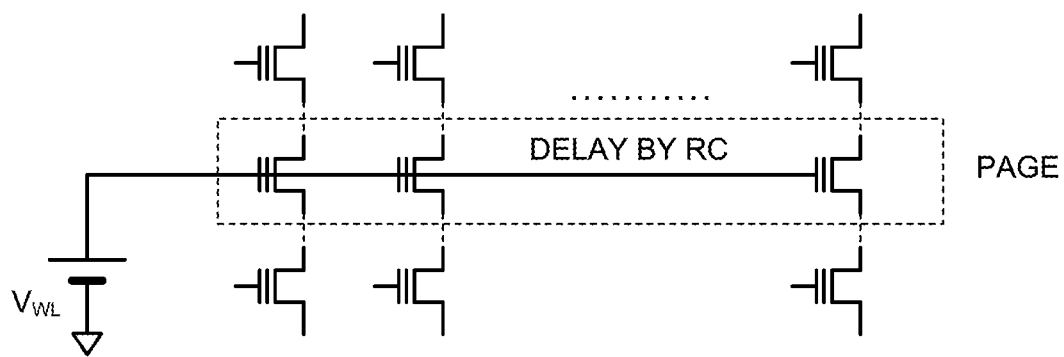

PRIOR ART FIG.9
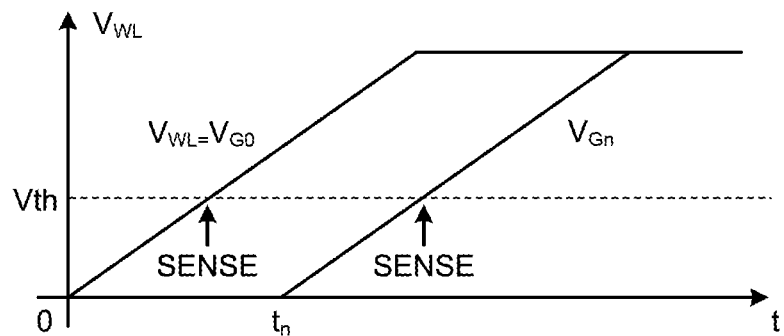
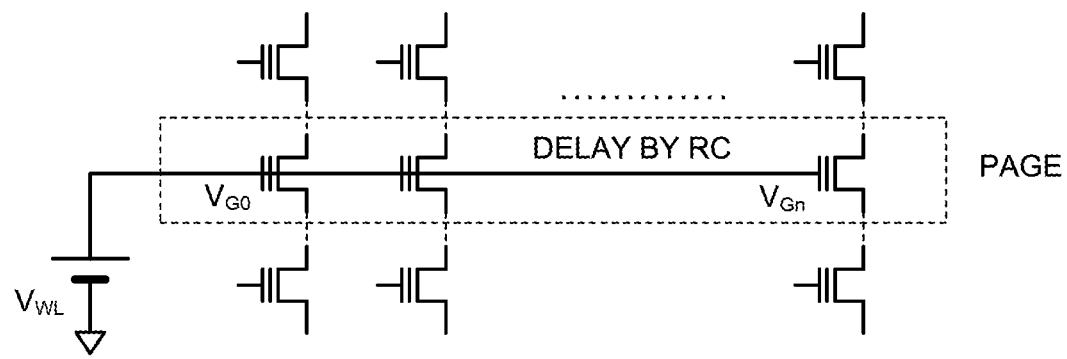
FIG.10
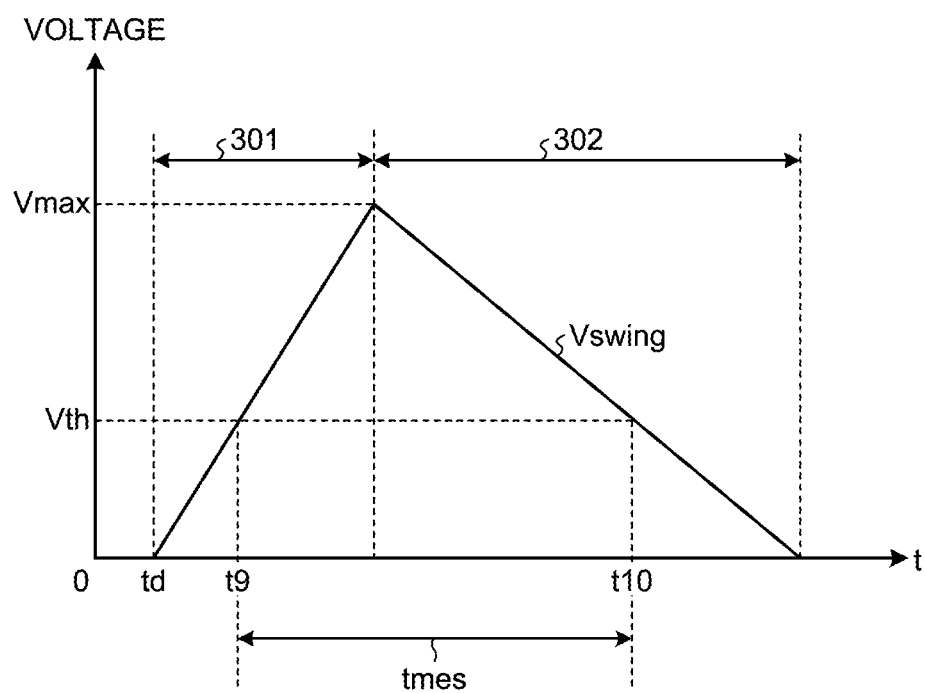

READ PROCESS IN A SEMICONDUCTOR MEMORY DEVICE INCLUDING A MEMORY CELL TRANSISTOR

CROSS-REFERENCE TO RELATED APPLICATIONS

This application is based upon and claims the benefit of priority from Japanese Patent Application No. 2018-054555, filed on Mar. 22, 2018; the entire contents of which are incorporated herein by reference.

FIELD

Embodiments described herein relate generally to a semiconductor memory device.

BACKGROUND

A semiconductor memory device including a memory cell transistor (memory cell) is known. The value of data stored in the memory cell is determined in a read process on the basis of a threshold voltage.

BRIEF DESCRIPTION OF THE DRAWINGS

FIG. 7 is a diagram illustrating two memory cells connected to a word line according to the first embodiment;

FIG. 8 is a diagram for explaining operation of a first comparative example;

FIG. 9 is a diagram for explaining operation of a second comparative example;

FIG. 10 is a diagram illustrating an example of a waveform of a word-line voltage of a second embodiment;

DETAILED DESCRIPTION

In general, according to one embodiment, a semiconductor memory device includes: a word line; a first memory cell; a first circuit; and a second circuit. The first memory cell is connected to the word line. The first circuit generates a first voltage having a waveform including a first time period during which a voltage value increases with time and a second time period during which the voltage value decreases with time, and applies the generated first voltage to the word line. The second circuit measures first time from a first timing when a state of the first memory cell changes according to the first voltage to a second timing when the state of the first memory cell changes according to the first voltage after the first timing. The second circuit determines first data stored in the first memory cell on the basis of the measured first time.

Exemplary embodiments of a semiconductor memory device will be explained below in detail with reference to the accompanying drawings. The present invention is not limited to the following embodiments.

First Embodiment

Figure 1:
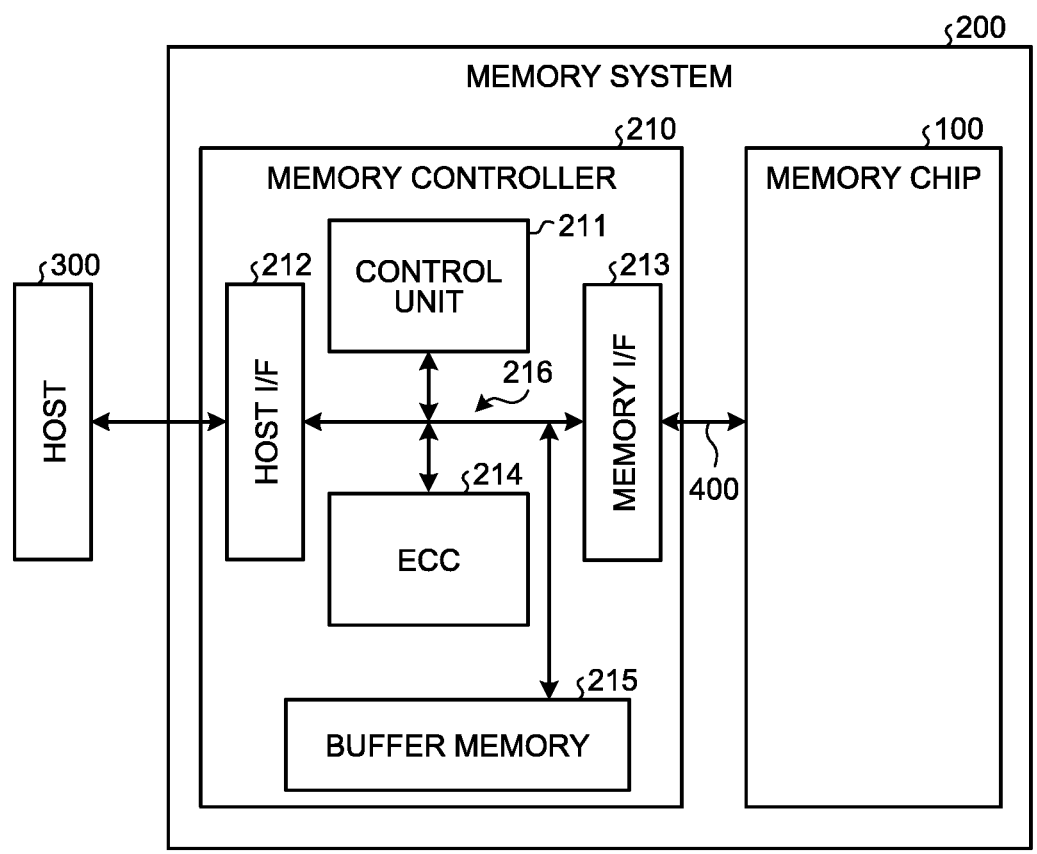
FIG. 1 is a diagram illustrating an example of a configuration of a memory system including a semiconductor memory device of a first embodiment.

FIG. 1 is a diagram illustrating an example of a configuration of a memory system 200 including a semiconductor memory device of a first embodiment. The memory system 200 is communicably connected to a host 300, and functions as an external storage medium for the host 300. The host 300 corresponds to, for example, a server, a personal computer, or a mobile information processing apparatus.

The memory system 200 includes a memory chip 100 and a memory controller 210. The memory controller 210 controls the memory chip 100 in accordance with requests from the host 300 or autonomously.

The memory chip 100 and the memory controller 210 are connected by a channel 400. The channel 400 is configured of a wire group including an I/O signal line and a control signal line. The I/O signal line includes a signal line for transmitting and receiving, for example, data, addresses, or commands. The commands include a program command for instructing a program process, a read command for instructing a read process, and an erase command for instructing an erase process. The control signal line includes signal lines for transmitting and receiving, for example, WE (write enable) signals, RE (read enable) signals, CLE (command latch enable) signals, ALE (address latch enable) signals, WP (write protect) signals, and DQS (data strobe) signals.

The memory controller 210 includes a control unit 211, a host I/F (interface) circuit 212, a memory I/F circuit (interface) 213, an ECC (error correction code) 214, a buffer memory 215, and a bus 216, which are communicably connected to each other via the bus 216. The control unit 211 is, for example, a CPU (central processing unit), and integrally controls each unit in the memory controller 210. The host I/F 212 communicates with the host 300. The memory I/F 213 exchanges addresses, data, and commands with the memory chip 100. The ECC 214 performs an error correction process on data read from the memory chip 100. The buffer memory 215 buffers data/instructions exchanged with the memory chip 100, and is used as a work area for the control unit 211.

The memory controller 210 can be configured as a semiconductor chip, for example, an SoC (System-On-a-Chip). The memory controller 210 may be configured of a plurality of semiconductor chips. Moreover, the control unit 211 may be configured of not a CPU but an MPU, an FPGA (field-programmable gate array), or ASIC (application specific integrated circuit). In other words, the memory controller 210 can be configured of software, hardware, or a combination thereof.

Figure 2:
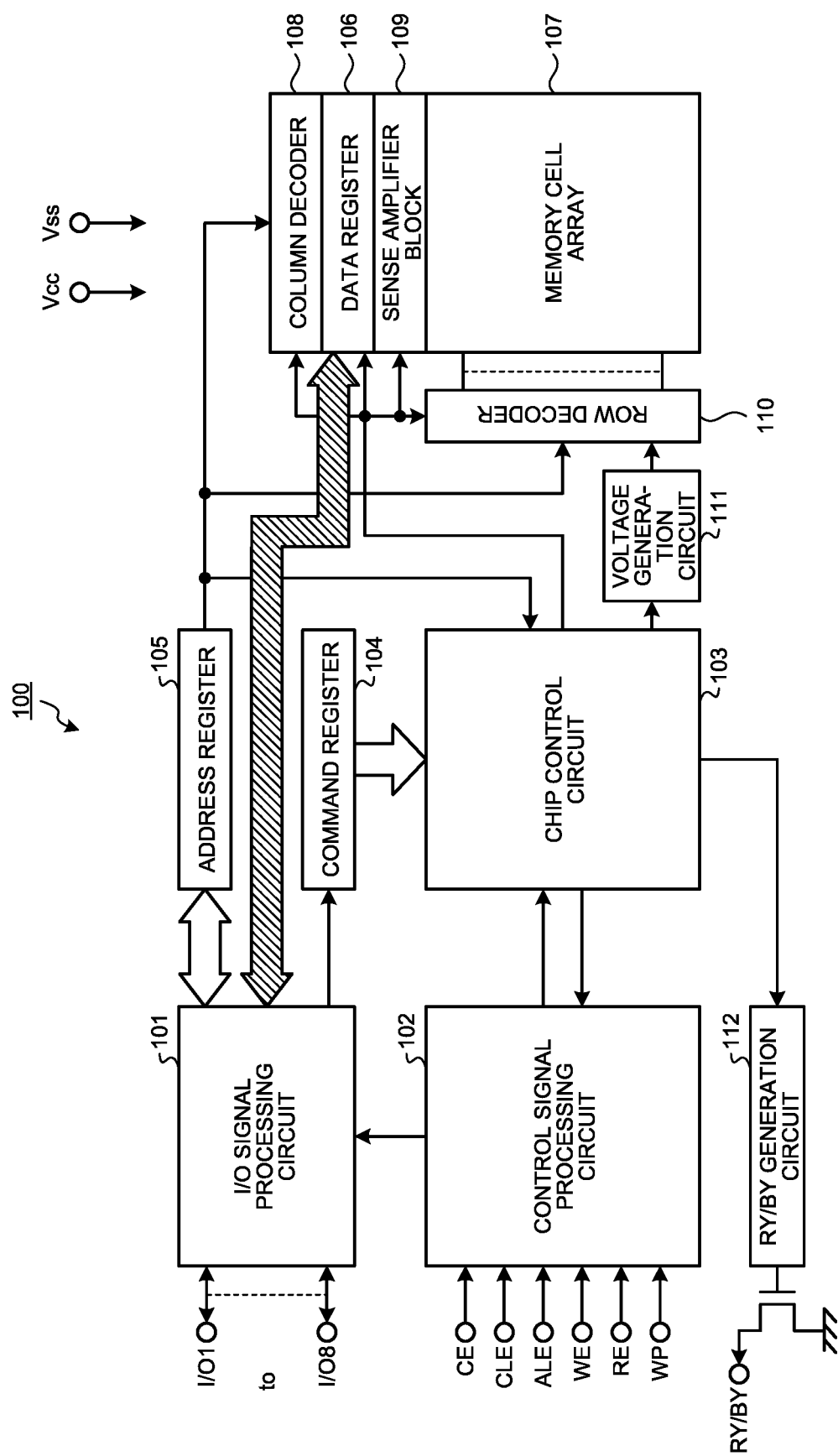
FIG. 2 is a diagram illustrating an example of a configuration of a memory chip in the semiconductor memory device according to the first embodiment.

The memory chip 100 is an example of the semiconductor memory device of the first embodiment. FIG. 2 is a diagram illustrating an example of a configuration of the memory chip 100 in the semiconductor memory device according to the first embodiment.

The memory chip 100 includes an I/O signal processing circuit 101, a control signal processing circuit 102, a chip control circuit 103, a command register 104, an address register 105, a data register 106, a memory cell array 107, a column decoder 108, a sense amplifier block 109, a row decoder 110, a voltage generation circuit 111, and an RY/BY generation circuit 112.

The row decoder 110 and the voltage generation circuit 111 are an example of a first circuit of the embodiments. Moreover, the sense amplifier block 109 is an example of a second circuit of the embodiments.

Figure 3:
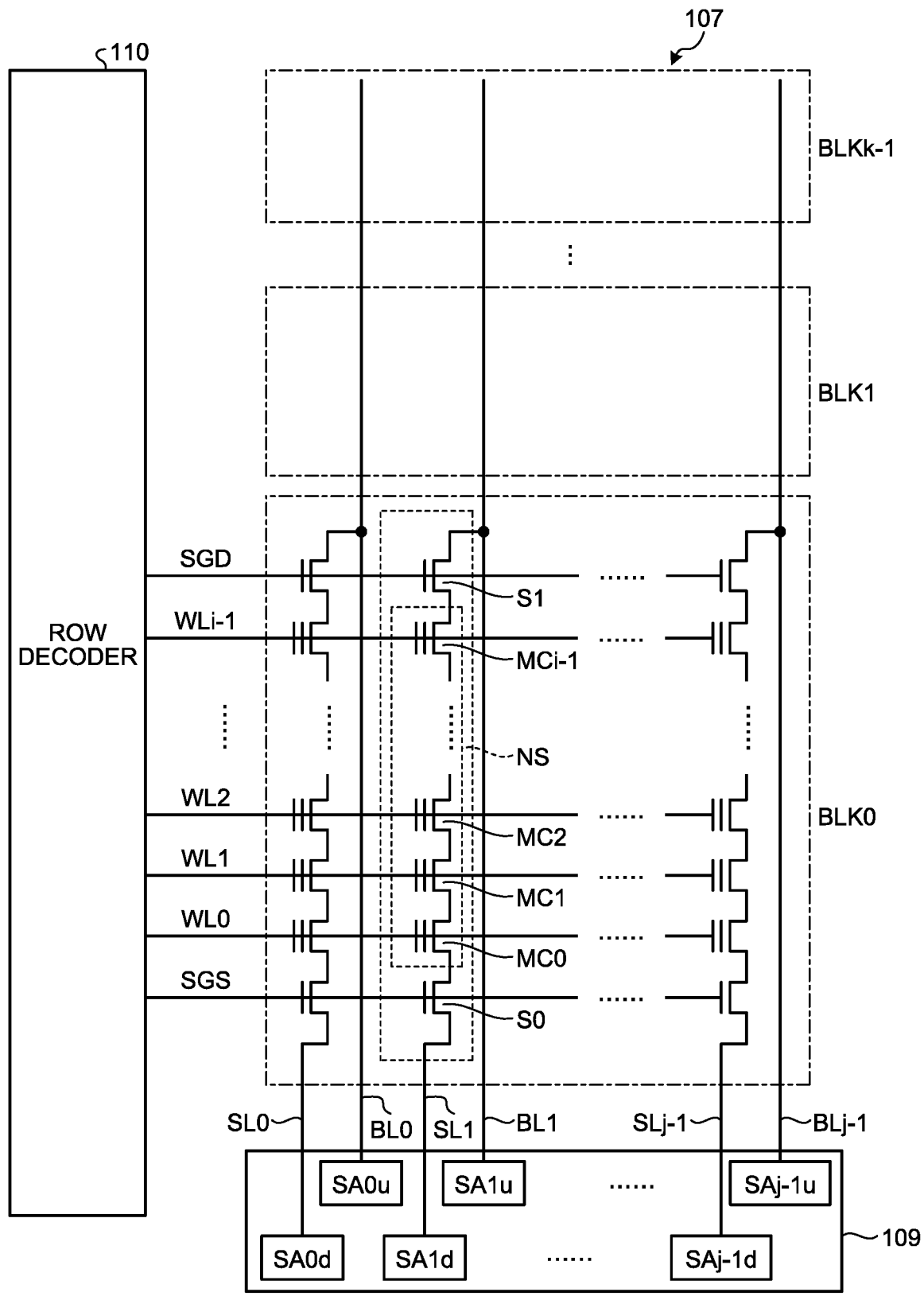
FIG. 3 is a diagram illustrating an example of a configuration of a memory cell array according to the first embodiment.

FIG. 3 is a diagram illustrating an example of a configuration of the memory cell array 107 according to the first embodiment. The memory cell array 107 illustrated in FIG. 3 includes k blocks (BLK0 to BLKk-1). All pieces of data stored in one block are erased collectively. Each of the k blocks has a similar configuration. Accordingly, a configuration of BLK0 is described here as a representative.

In BLK0, a memory cell unit is configured of a NAND string NS including i series-connected memory cells (memory cell transistors) MC0 to MCi-1, and selective gate transistors S0 and S1 respectively connected at both ends of the NAND string NS. Each of the memory cells MC0 to MCi-1 is a NAND type memory cell. A source of the selective gate transistor S0 is connected to a source line SL (SL0 to SLj-1). A drain of the selective gate transistor S1 is connected to a bit line BL (BL0 to BLj-1).

The sense amplifier block 109 includes j sense amplifiers (SA0$u$ to SAj-1$u$) corresponding to j bit lines BL0 to BLj-1, and j sense amplifiers (SA0$d$ to SAj-1$d$) corresponding to j source lines SL0 to SLj-1. The function of each sense amplifier is described below.

Gates of the selective gate transistors S0 and S1 are connected to selective gate lines SGS and SGD, respectively. The selective gate lines SGS and SGD are used to select the bit line.

Control gates of the memory cells MC0 to MCi-1 are connected to word lines WL (WL0 to WLi-1), respectively. In other words, control gate electrodes of the memory cells MC in the same row are connected to the same word line WL in the block. If each memory cell MC is configured in such a manner as to be capable of holding a one-bit value, j memory cells MC connected to the same word line WL are handled as one page. The program process and the read process are performed page by page.

Each memory cell MC may be configured in such a manner as to be capable of holding a plural-bit values. For example, if each memory cell MC can store an x (x≥2)-bit values, a storage capacity per word line WL is equal to a size equal to x pages.

Figure 4:
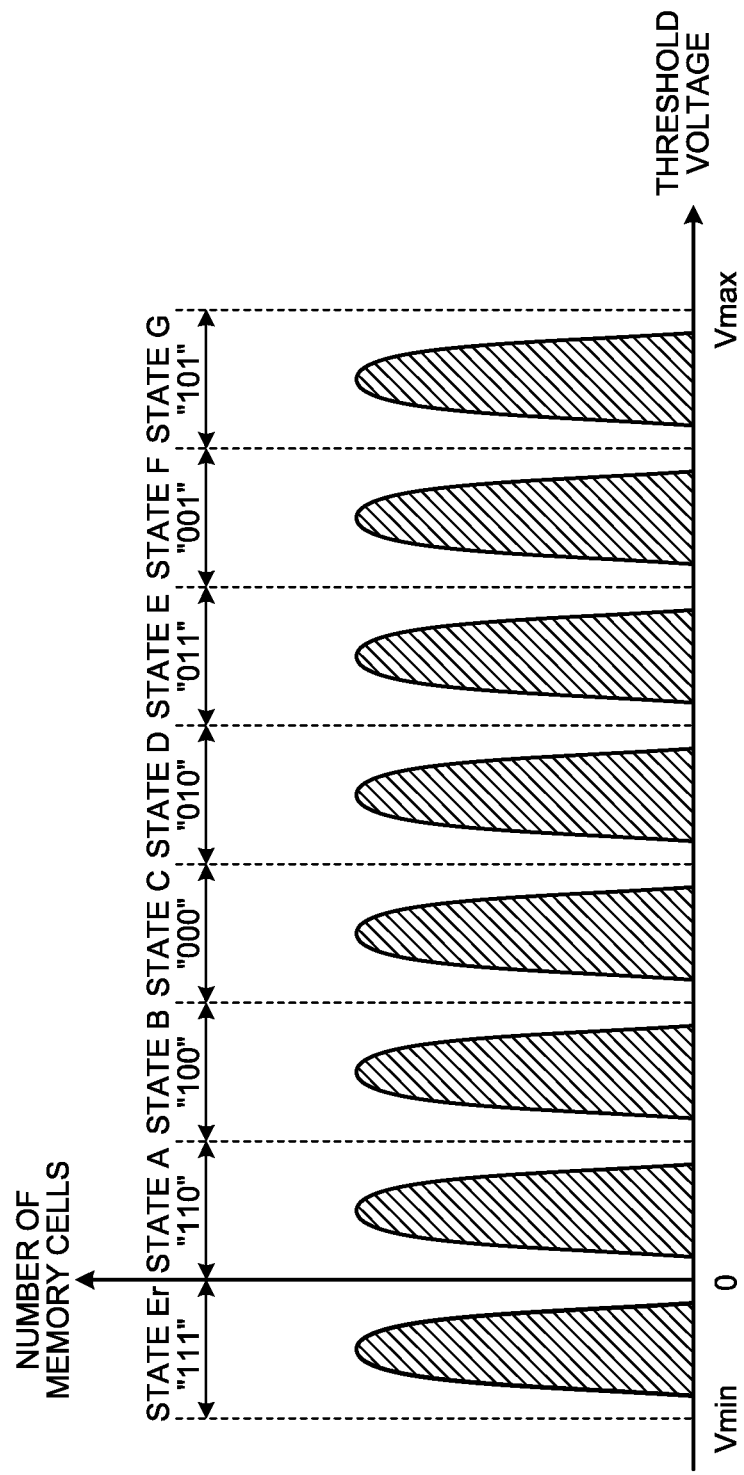
FIG. 4 is a diagram for explaining an example of a configuration of threshold voltages according to the first embodiment.

FIG. 4 is a diagram for explaining an example of a configuration of threshold voltages in a case where a three-bit value is stored in one memory cell MC. In FIG. 4, the vertical axis indicates the number of memory cells, and the horizontal axis indicates threshold voltages of the memory cells.

A range where the threshold voltage is controlled (the range from Vmin to Vmax in FIG. 4) is divided into eight small areas. Each small area is associated with a different three-bit value. Each small area is also referred to as a state.

In the example of FIG. 4, the eight small areas are handled as state Er, state A, state B, state C, state D, state E, state F, and state G, starting on the low voltage side. The state Er corresponds to "111", the state A corresponds to "110", the state B corresponds to "100", the state C corresponds to "000", the state D corresponds to "010", the state E corresponds to "011", the state F corresponds to "001", and the state G corresponds to "101".

In the program process, the threshold voltage of the memory cell MC targeted for programming is controlled in such a manner as to belong to a state corresponding to data to be programmed among the eight states. As a result, eight arch-shaped hatched distributions of FIG. 4 are formed in the programmed page or block.

An correspondence relation between the states and the data is not limited to the example illustrated in FIG. 4. Moreover, according to the example of FIG. 4, the range where the threshold voltage is controlled (the range from Vmin to Vmax) is set extending from the negative area to the positive area. The setting of the range where the threshold voltage is controlled is not limited to the above. For example, the range where the threshold voltage is controlled may be set only in the positive area.

In the read process, data corresponding to the threshold voltage (more specifically, data corresponding to a state to which the threshold voltage belongs) is determined.

The description is returned to FIG. 2. The RY/BY generation circuit 112 causes a state of an RY/BY signal line to transition between a ready state (RY) and a busy state (BY) under control of the chip control circuit 103.

The I/O signal processing circuit 101 is a buffer circuit for transmitting and receiving I/O signals to and from the memory controller 210 via the I/O signal line. The I/O signal processing circuit 101 can capture a command, an address, or data via the I/O signal line. The I/O signal processing circuit 101 stores a command in the command register 104, stores an address in the address register 105, and stores data in the data register 106, or reads data from the data register 106.

The control signal processing circuit 102 accepts the input of various control signals, and assigns a register being a storage destination of the I/O signal accepted by the I/O signal processing circuit 101 on the basis of the accepted control signal.

A ground voltage Vss and a power supply voltage Vcc are supplied from the outside to the voltage generation circuit 111. The voltage generation circuit 111 generates a voltage to be supplied to each circuit on the basis of these voltages and an instruction of the chip control circuit 103.

The address stored in the address register 105 include a row address and a column address. The row address and the column address are stored in the row decoder 110 and the column decoder 108, respectively.

The chip control circuit 103 is a state machine that transitions a state of the chip control circuit 103 in accordance with various control signals received via the control signal processing circuit 102, and controls the entire operation of the memory chip 100. For example, the chip control circuit 103 issues an instruction for controlling, for example, an operating voltage and an operation timing to the row decoder 110, the column decoder 108, the sense amplifier block 109, and the voltage generation circuit 111 and, accordingly, controls access (for example, the program process and the read process) to the memory cell array 107.

In the program process, the row decoder 110 selects the word line WL on the basis of the row address. The column decoder 108 selects the bit line BL on the basis of the column address. A programming pulse is applied from the word line WL (denoted as the word line WLsel) selected by the row decoder 110 through the row decoder 110 to the memory cell MC (denoted as the memory cell MCsel) located at an intersection point of the word line WLsel and the bit line BL (denoted as the bit line BLsel) selected by the column decoder 108. With application of the programming pulse, the threshold voltage of the memory cell MCsel is set to a state corresponding to data stored in the data register 106 among states Er to G.

In the read process, firstly, the word line WLsel and the bit line BLsel are selected on the basis of the row address and the column address as in the program process. A word-line voltage is applied from the word line WLsel through the row decoder 110 to the memory cell MCsel located at an intersection point of the word line WLsel and the bit line BLsel. The sense amplifier block 109 detects a change in the state of the memory cell MCsel in accordance with the word-line voltage and, accordingly, determines the data to store the determination result (data) in the data register 106. The data stored in the data register 106 is transmitted through a data line to the I/O signal processing circuit 101, and transferred from the I/O signal processing circuit 101 to the memory controller 210.

Figure 5:
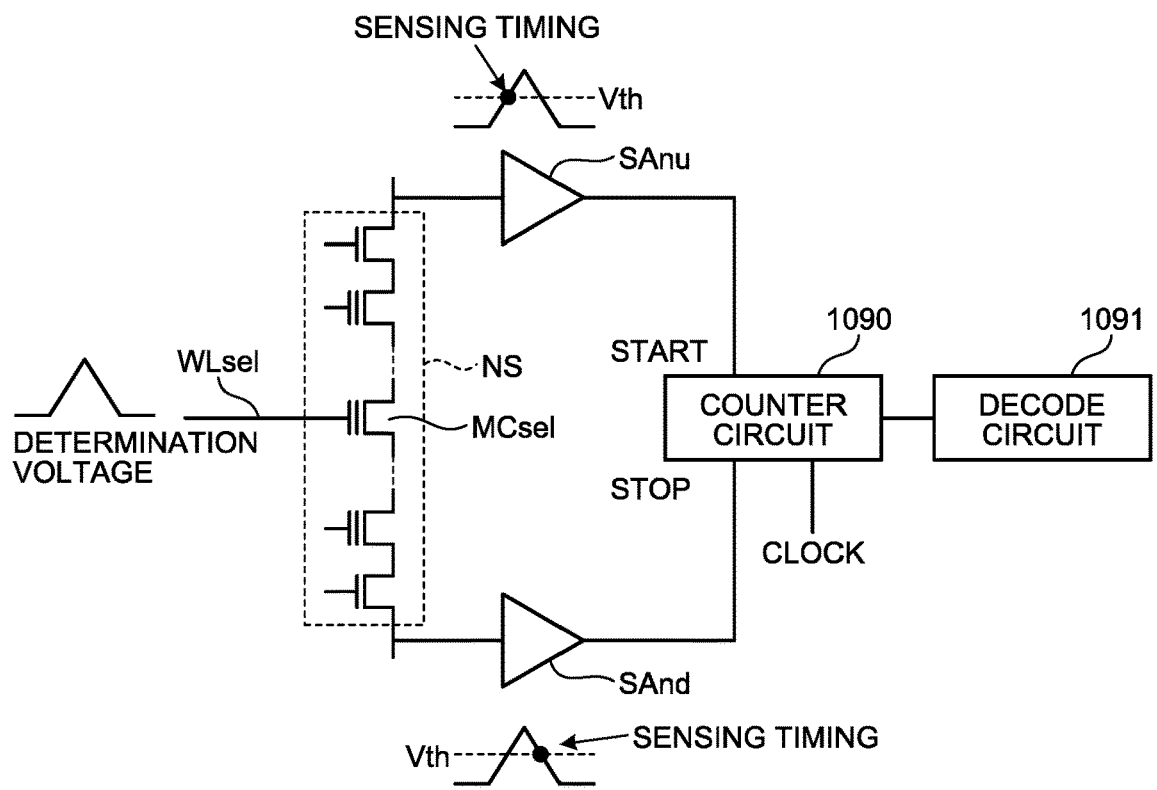
FIG. 5 is a diagram illustrating an example of a configuration of a sense amplifier according to the first embodiment.
Figure 6:
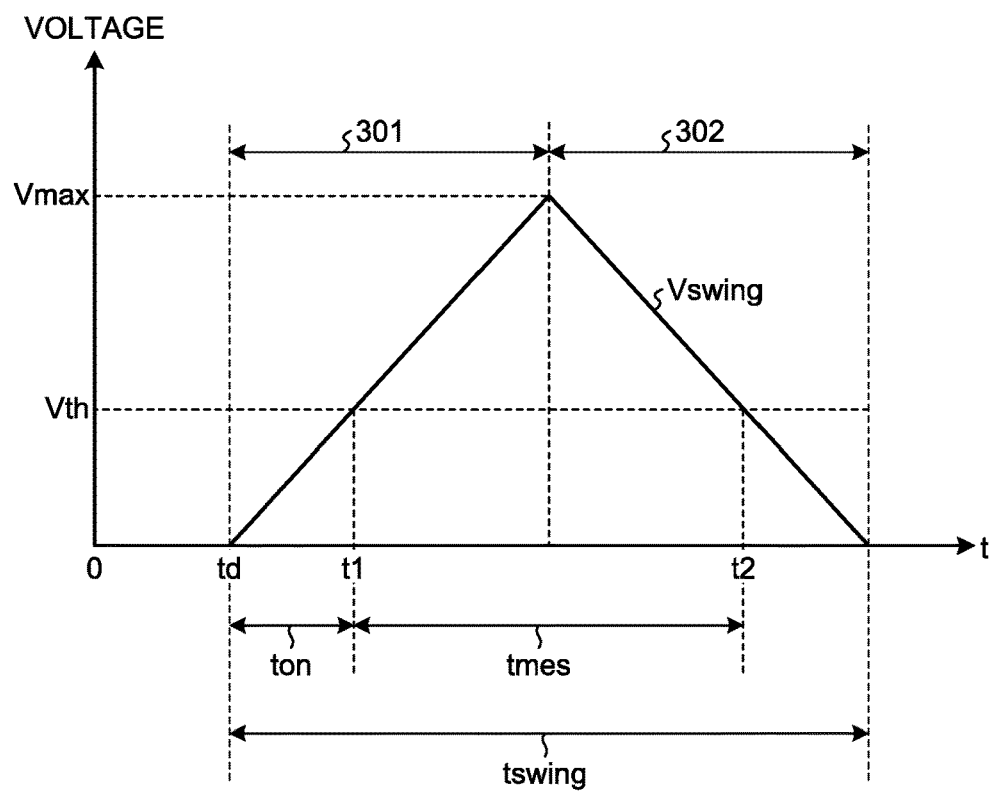
FIG. 6 is a diagram for specifically explaining a target period according to the first embodiment.

Here, in the first embodiment, the sense amplifier SA has such a configuration as illustrated in FIG. 5 as a configuration for determining data corresponding to the threshold voltage in the read process. A word-line voltage of such a waveform as illustrated in FIG. 6, the waveform including a period (a time period) during which the voltage value increases with time and a period (a time period) during which the voltage value decreases with time, is applied to the word line WLsel of the memory cell MCsel targeted for a read. In an example of FIG. 6, the voltage value is caused to increase linearly from zero to Vmax with time during a period (a time period) 301. When the voltage value reaches Vmax, the voltage value is caused to decrease linearly from Vmax to zero with time during a period (a time period) 302. Here, the waveform of the period 301 and the waveform of the period 302 are symmetrical.

Two sense amplifiers SAnu and SAnd illustrated in FIG. 5, and a counter circuit 1090 together measure time from a timing when the state of a memory cell targeted for a read changes according to the word-line voltage to the next timing when the state of the memory cell changes according to the word-line voltage. In other words, the operation in a case where such a word-line voltage as illustrated in FIG. 6 is applied to the word line WLsel of the memory cell MCsel targeted for a read is as follows: "n" in SAnu and SAnd is an integer from zero to j−1.

The sense amplifier SAnu is a first sense amplifier, and detects the current flowing through the NAND string NS when the word-line voltage is in the period 301 of FIG. 6. The initial voltage value of the period 301 is 0 V. The current does not flow through the NAND string NS except when the memory cell MCsel is in state Er. In other words, if at this point in time, the current flows through NS and the first sense amplifier SAnu detects the current, for example, a decode circuit 1091 determines that MCsel is in state Er.

If the memory cell MCsel is in a state other than state Er, the word-line voltage starts increasing. When the word-line voltage reaches the value of a threshold voltage Vth set in the memory cell MCsel, that is, at time t1 of FIG. 6, the first sense amplifier SAnu detects the current flowing through the NAND string NS, transmits a signal to a start terminal of the downstream counter circuit 1090, and causes the counter circuit 1090 to start a counting operation.

The sense amplifier SAnd is a second sense amplifier, and detects the current flowing through the NAND string NS when the word-line voltage is in the period 302 of FIG. 6. The initial voltage value of the period 302 is Vmax. The NAND string NS is in a state where the current is flowing. When the word-line voltage decreases to the value of the threshold voltage Vth written in the memory cell MCsel, that is, at time t2 of FIG. 6, the second sense amplifier SAnd detects that the current has stopped flowing through NS, transmits a signal to a stop terminal of the downstream counter circuit 1090, and causes the counter circuit 1090 to stop the counting operation.

The counter circuit 1090 then outputs the result of the counting operation as tmes illustrated in FIG. 6 to the decode circuit 1091. The rate of change of the voltage per unit time is a preset value in each of the periods 301 and 302. Accordingly, the decode circuit 1091 can calculate the threshold voltage Vth written in the memory cell MCsel on the basis of the values of the rates of change of the voltage and tmes.

In this manner, the use of the two sense amplifiers SAnu and SAnd allows the determination of accurate start and stop times of the counter circuit 1090. Hence, even if there is a difference in the arrival time of the word-line voltage between a plurality of memory cells as illustrated in FIG. 7, tmes can be accurately determined. The threshold voltage Vth written in each memory cell can be accurately obtained.

If the word-line voltage of such a waveform as illustrated in FIG. 6 is applied, time ton from the timing when the voltage value rises (time td) to time t1 is obtained by the following equation (1). Here, tswing is the time from the start of the period 301 to the end of the period 302, and is a known period of time.

$$\text{ton}=(t\text{swing}-t\text{mes})/2 \tag{1}$$

The rate of increase of the voltage per unit time in the period 301 of the waveform of FIG. 6 and the rate of decrease of the voltage per unit time in the period 302 are set at a known setting value ΔV. Accordingly, the use of ΔV and tmes makes it possible to obtain the threshold voltage Vth of the MCsel from equation (2).

$$\text{Vth}=\Delta V \times t\text{mes} \tag{2}$$

The decode circuit 1091 obtains the threshold voltage Vth, using equations (1) and (2), and acquires a value corresponding to a state to which the obtained threshold voltage Vth belongs.

The timing when the word-line voltage reaches the memory cell is delayed by an amount corresponding to the location of the memory cell (the distance from the row decoder 110).

For example, as illustrated in FIG. 7, a first memory cell MCsela and a second memory cell MCselb are connected to the word line WLsel. If the second memory cell MCselb is connected to a location farther from the row decoder 110 than the first memory cell MCsela, a timing when the start point of the word-line voltage reaches the second memory cell MCselb (time t4) is later than a timing when the start point of the word-line voltage reaches the first memory cell MCsela (time t3).

However, the word-line voltage is carried, keeping its waveform. Accordingly, both of the timing when the state of a memory cell changes from an off state to an on state and the timing when the state of the memory cell changes from the on state to the off state are delayed by the same amount. In other words, the duration of a target period is not affected by the delay of the word-line voltage. Moreover, equation (1) does not include a delay amount td.

In this manner, the use of the word-line voltage of such a waveform as illustrated in FIG. 6 makes it possible to accurately determine the start time and the stop time of the counter circuit 1090. Hence, even if there is such a difference in the arrival time of the word-line voltage between a plurality of memory cells as illustrated in FIG. 7, tmes can be accurately determined. The threshold voltage Vth written in each memory cell can be accurately determined.

A method is known which determines data corresponding to a threshold voltage, using a plurality of read voltages corresponding to boundaries between adjacent states as illustrated in FIG. 8. This method is denoted as the first comparative example. In the first comparative example, the plurality of read voltages is sequentially supplied to the word line WLsel to determine, according to the read voltages, whether or not the current has flown through the memory cell MCsel.

However, according to the first comparative example, it is necessary to wait for the process of determining whether or not the current has flown through each memory cell MCsel until the voltage applied to the control gate electrodes of all memory cells MCsel in a page connected to the word line WLsel becomes stable (that is, until the gate voltages of all the memory cells in the page rise). The process is caused to wait for each read voltage to be stabilized, thereby the time required for the read process increases.

Furthermore, in recent years, there has been a tendency that the number of bits of data stored in each memory cell MC increases. The number of states set in the range from Vmin to Vmax increases with increasing number of bits per memory cell MC. Hence, if the first comparative example is applied, the required number of read voltages increases. As a result, the time required for the read process further increases.

An overview of a reading method of G. Naso et al. ("A 128 Gb 3b/cell NAND Flash Design Using 20 nm Planar-Cell Technology" 2013 International Solid-State Circuits Conference, DIGEST OF TECHNICAL PAPERS, p. 218-219) is illustrated in FIG. 9. According to the reference, a ramp voltage is applied to a word line. This method is denoted below as the second comparative example. The use of this method eliminates the necessity of waiting until the states of all memory cells become stable even if there is a delay in the word line, and allows a reduction in the time required for the read process. Moreover, the voltage applied to the word line exceeds Vth in all cells in a page, and the time when the sense amplifier operates can also be accurately measured. However, in the second comparative example, it is difficult to accurately measure the time when the ramp voltage starts rising, that is, to of FIG. 9, in terms of a far memory cell, thereby the accuracy of a read becomes worse.

As compared to the first and second comparative examples, according to the first embodiment, the word-line voltage that changes continuously with time is supplied and the duration of a target period is measured. Accordingly, data can be read at higher speed than in the first comparative example, and can be read more accurately than in the second comparative example. Furthermore, if the number of bits per memory cell MC increases, advantage in the high-speed operation against the first comparative example becomes larger.

That is, according to the first embodiment, the memory chip 100 can read data at high speed and with accuracy.

Second Embodiment

In the first embodiment, the voltage of the waveform illustrated by example in FIG. 6 has been described as an example of the word-line voltage. Various changes can be made to the word-line voltage as long as the word-line voltage has a waveform including a period during which the voltage value increases with time and a period during which the voltage value decreases with time.

For example, as illustrated in FIG. 10, the length of the period 301 and the length of the period 302 may be different. According to an example of FIG. 10, the memory cell MCsel changes from the off state to the on state at time t9, and changes from the on state to the off state at time t10. As described above, the amount of change of the voltage per unit time in each of the periods 301 and 302 is predetermined. Accordingly, Vth of the memory cell MCsel can be calculated on the basis of the amount of change of the voltage per unit time and tmes.

Figure 11:
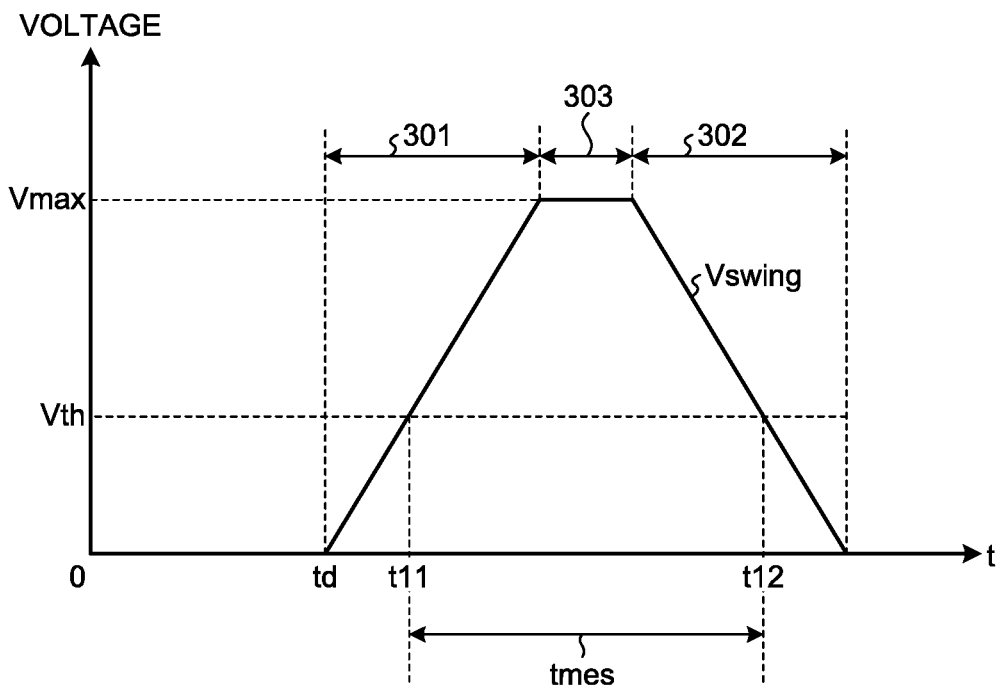
FIG. 11 is a diagram illustrating another example of the waveform of the word-line voltage of the second embodiment.

In another example, as illustrated in FIG. 11, a period 303 during which the voltage is maintained at a fixed value may be provided between the periods 301 and 302. According to the example of FIG. 11, the memory cell MCsel changes from the off state to the on state at time t11. The memory cell changes from the on state to the off state at time t12. A period from time t11 to time t12 is measured as the duration tmes of a target period. Rates of change of the voltage per unit time in the periods 301 and 302 and the duration of the period 303 are predetermined. Accordingly, Vth of the memory cell MCsel can be calculated on the basis of these values and tmes.

Figure 12:
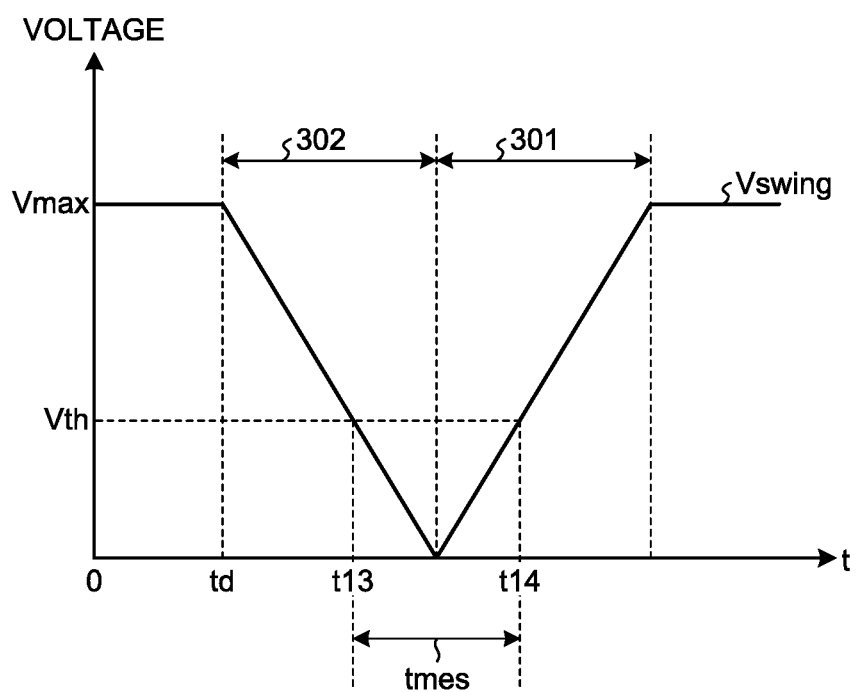
FIG. 12 is a diagram illustrating another example of the waveform of the word-line voltage of the second embodiment.

In still another example, as illustrated in FIG. 12, another period 302 may be set prior to the period 301. According to the example of FIG. 12, when the voltage applied to the control gate electrode falls below the threshold voltage of the memory cell MCsel, the state of the memory cell MCsel changes from the on state to the off state as a first change (time t13). When the voltage applied to the control gate electrode turns into an increase and then exceeds the threshold voltage of the memory cell MCsel, the state of the memory cell MCsel changes from the off state to the on state as the next change (time t14). In the example of FIG. 12, the time from time t13 to time t14 is measured as the duration tmes of the target period. The rates of change of the voltage per unit time in the periods 301 and 302 are preset values. Accordingly, Vth of the memory cell MCsel can be calculated on the basis of these values and tmes.

Figure 13:
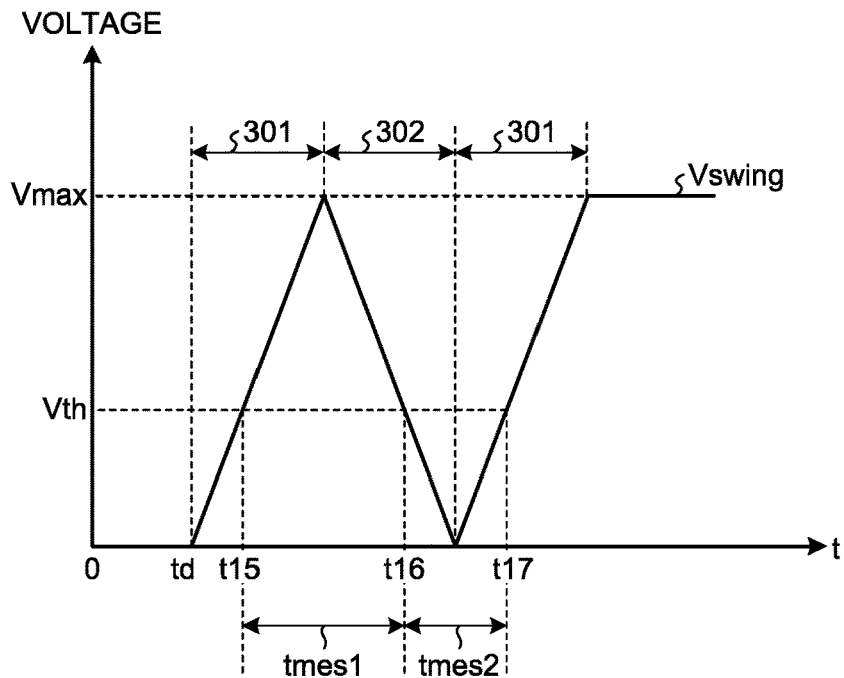
FIG. 13 is a diagram illustrating another example of the waveform of the word-line voltage of the second embodiment.

A plurality of the periods 301 during which the voltage value increases or the periods 302 during which the voltage value decreases may be provided. For example, as illustrated in FIG. 13, the period 301 is set first. The period 302 is set next. The period 301 is set lastly. In such a case, for example, the time from time t15 to time t16 is measured as a duration tmes1 of a first target period, the time from time t16 to time t17 is measured as a duration tmes2 of a second target period. The decode circuit 1091 then uses tmes1 and tmes2 to acquire data. For example, the threshold voltage Vth is obtained on the basis of each of tmes1 and tmes2. Data is then acquired on the basis of an average value of the obtained threshold voltages Vth.

The method for acquiring data in the case where a plurality of the periods 301 during which the voltage value increases or the periods 302 during which the voltage value decreases is set is not limited to the above method.

Moreover, in the description of the first and second embodiments, the value of the word-line voltage is assumed to change linearly with time during each period (the periods 301, 302, and 303). The change of the value of the word-line voltage may not change linearly with time. If the change of the value of the word-line voltage is not linear with time, an algorithm for determining the threshold voltage Vth applied to the decode circuit 1091 is simply required to change according to the change of the voltage value.

Moreover, in the description of the first and second embodiments, the word-line voltage is assumed to change within the range from zero to Vmax in each period (the periods 301, 302, and 303). The range where the word-line voltage is changed during each period is not limited to the above range. The upper limit of the word-line voltage in each period may be higher than Vmax or lower than Vmax. The lower limit of the word-line voltage in each period may be higher than zero or lower than zero. It is at least possible to determine data corresponding to the threshold voltage Vth on the basis of tmes when the threshold voltage Vth is within the range where the word-line voltage can be changed.

Third Embodiment

A sequence of a program process (a program sequence) may include a read process. The first and second embodiments may be applied to the read process included in the program sequence.

Figure 14:
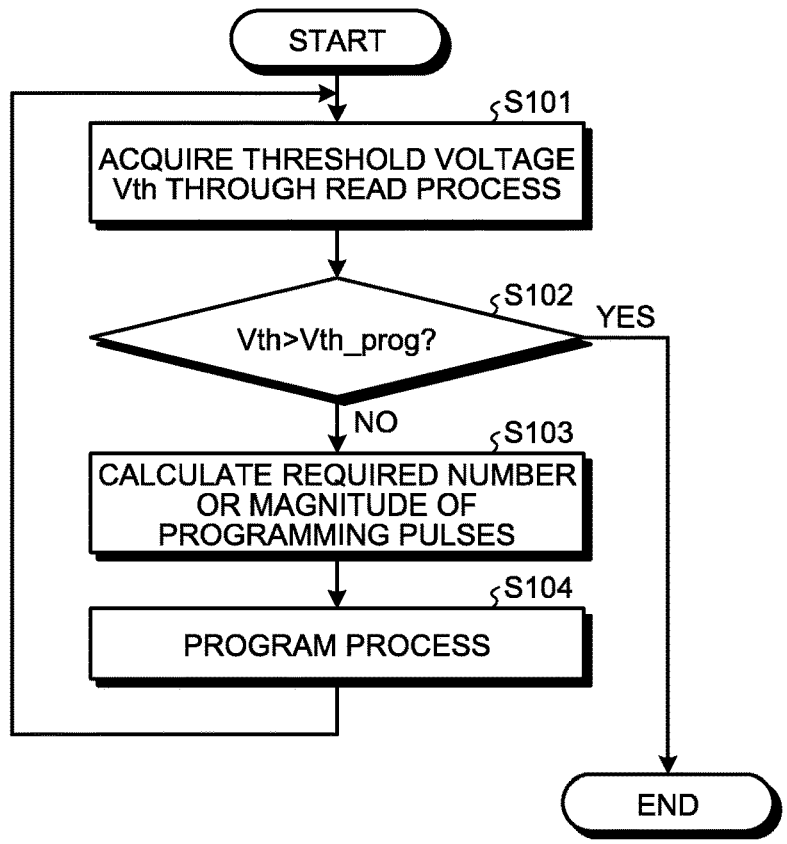
FIG. 14 is a flowchart for explaining a sequence of a program process of a third embodiment.

FIG. 14 is a flowchart for explaining a program process sequence of a third embodiment. When the program sequence starts, a read process is executed first (S101).

In S101, each sense amplifier SA measures the duration tmes of a target period. The decode circuit 1091 acquires the threshold voltage Vth from tmes, and outputs the acquired threshold voltage Vth.

Next, it is determined whether or not the threshold voltage Vth has exceeded a target threshold voltage Vth_grog (S102). The target threshold voltage Vth_grog has a predetermined value within a range of a state corresponding to data to be programmed. The process of S102 is executed by, for example, the chip control circuit 103.

If it is determined that the threshold voltage Vth has not exceeded the target threshold voltage Vth_prog (S102, No), the required number or magnitude of programing pulses is calculated (S103).

The process of S103 is executed by, for example, the chip control circuit 103. As an alienation between the threshold voltage Vth and the target threshold voltage Vth_grog is larger, the larger number of programing pulses or the larger magnitude of programing pulses is set.

The program process is then executed (S104). In other words, the programming pulses whose number or magnitude was calculated in S103 are applied to the memory cell MCsel.

The process of S101 is then executed again.

If it is determined that the threshold voltage Vth has exceeded the target threshold voltage Vth_grog (S102, Yes), the program sequence ends.

That is, in S101 to S102, the duration tmes of the target period is measured, and it is determined whether or not the program sequence has been completed, on the basis of the measured tmes.

In this manner, the completion of the program sequence may be determined, using the read process to which the first or second embodiment is applied. Consequently, the time required to complete the program sequence can be reduced.

Moreover, the required number or magnitude of programming pulses may be determined, using the read process to which the first or second embodiment is applied. Consequently, the time required to complete the program sequence can be reduced.

The threshold voltage of the erased memory cell is in state Er and is equal to or less than 0 V. Hence, if the loop process of S101 to S104 is executed for the first time after the erasure, the read process may not be executed in S101, and the subsequent processes may be executed assuming that threshold voltage Vth is 0 V.

The configuration of each sense amplifier SA described in the first to third embodiments is an example. As long as the time interval between the timing when the state of the memory cell MCsel changes from the off state to the on state and the timing when the state of the memory cell MCsel changes from the off state to the on state is detected to determine data on the basis of the detected time interval, each sense amplifier SA can be configured in any manner.

Moreover, in the first to third embodiments, the example where the memory cell array 107 includes two-dimensionally arranged memory cells MC is described. The memory cell array 107 may have a configuration where memory cells MC are arranged three-dimensionally. For example, a columnar semiconductor pillar penetrates a stacked body where a conductive film and an insulating film are alternatingly stacked, and a memory cell MC is provided at a portion where a conductive film and a semiconductor pillar intersect. In other words, the NAND string NS is provided perpendicularly to a substrate. As with the structure illustrated in FIG. 3, the first sense amplifier SAnu is provided at one end of the NAND string NS, and the second sense amplifier SAnd at the other end of the NAND string NS.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a word line;
   a first memory cell connected to the word line;
   a first circuit configured to generate a first voltage having a waveform including a first time period during which a voltage value increases with time and a second time period during which the voltage value decreases with time, and apply the generated first voltage to the word line; and
   a second circuit configured to measure first time from a first timing when a state of the first memory cell changes according to the first voltage to a second timing when the state of the first memory cell changes according to the first voltage after the first timing, and determine first data stored in the first memory cell on the basis of the measured first time, wherein
   the second circuit includes:
   a first sense amplifier configured to detect the first timing;
   a second sense amplifier configured to detect the second timing;
   a counter circuit configured to measure the first time on the basis of outputs of the first and second sense amplifiers; and
   a decode circuit configured to determine the first data on the basis of the measurement result of the counter circuit.

2. The semiconductor memory device according to claim 1, further comprising a second memory cell connected to the word line, wherein the second circuit is further configured to measure second time from a third timing when a state of the second memory cell changes according to the first voltage to a fourth timing when the state of the second memory cell changes according to the first voltage after the third timing, and determine second data stored in the second memory cell on the basis of the measured second time.

3. The semiconductor memory device according to claim 1, wherein the second circuit is further configured to measure the first time upon programming second data into the first memory cell, and determine whether or not the programming has been completed on the basis of the measured first time.

4. The semiconductor memory device according to claim 1, wherein the second circuit is further configured to measure the first time upon programming second data into the first memory cell, and determine a number or magnitude of programming pulses on the basis of the measured first time.

5. The semiconductor memory device according to claim 1, wherein
the first memory cell is a NAND type memory cell in a NAND string comprises multiple NAND type memory cells connected in series, and
one end of the NAND string is connected to the first sense amplifier, and the other end of the NAND string is connected to the second sense amplifier.

6. The semiconductor memory device according to claim 1, wherein
the first memory cell is a NAND type memory cell in a NAND string comprises multiple NAND type memory cells connected in series,
the first sense amplifier is further configured to cause the counter circuit to start a counting operation upon detecting that current has started flowing through the NAND string in the first time period, and
the second sense amplifier is further configured to cause the counter circuit to stop the counting operation upon detecting that the current has stopped flowing through the NAND string in the second time period.

7. The semiconductor memory device according to claim 1, wherein the first circuit is further configured to change the voltage value linearly with time during the first and second time periods.

8. The semiconductor memory device according to claim 1, wherein the waveform of the first voltage includes the second time period after the first time period.

9. The semiconductor memory device according to claim 1, wherein the waveform of the first voltage includes the first time period after the second time period.

10. A semiconductor memory device comprising:
a word line;
a first memory cell connected to the word line; and
a circuit configured to supply, to the word line, a voltage having a waveform including a first time period during which a voltage value increases with time and a second time period during which the voltage value decreases with time, measure first time from a first timing when a state of the first memory cell changes according to the voltage to a second timing when the state of the first memory cell changes according to the voltage after the first timing, and determine first data stored in the first memory cell on the basis of the measured first time, wherein
the circuit includes:

a first sense amplifier configured to detect the first timing;
a second sense amplifier configured to detect the second timing;
a counter circuit configured to measure the first time on the basis of outputs of the first and second sense amplifiers; and
a decode circuit configured to determine the first data on the basis of the measurement result of the counter circuit.

11. The semiconductor memory device according to claim 10, further comprising a second memory cell connected to the word line, wherein the circuit is further configured to measure second time from a third timing when a state of the second memory cell changes according to the voltage to a fourth timing when the state of the second memory cell changes according to the voltage after the third timing, and determine second data stored in the second memory cell on the basis of the measured second time.

12. The semiconductor memory device according to claim 10, wherein the circuit is further configured to measure the first time upon programming second data into the first memory cell, and determine whether or not the programming has been completed on the basis of the measured first time.

13. The semiconductor memory device according to claim 10, wherein the circuit is further configured to measure the first time upon programming second data into the first memory cell, and determine a number or magnitude of programming pulses on the basis of the measured first time.

14. The semiconductor memory device according to claim 10, wherein
the first memory cell is a NAND type memory cell in a NAND string comprises multiple NAND type memory cells connected in series, and
one end of the NAND string is connected to the first sense amplifier, and the other end of the NAND string is connected to the second sense amplifier.

15. The semiconductor memory device according to claim 10, wherein
the first memory cell is a NAND type memory cell in a NAND string comprises multiple NAND type memory cells connected in series,
the first sense amplifier is further configured to cause the counter circuit to start a counting operation upon detecting that current has started flowing through the NAND string in the first time period, and
the second sense amplifier is further configured to cause the counter circuit to stop the counting operation upon detecting that the current has stopped flowing through the NAND string in the time second period.

16. The semiconductor memory device according to claim 10, wherein the circuit is further configured to change the voltage value linearly with time during the first and second time periods.

17. The semiconductor memory device according to claim 10, wherein the waveform of the voltage includes the second time period after the first time period.

18. The semiconductor memory device according to claim 10, wherein the waveform of the voltage includes the first time period after the second time period.

* * * * *